United States Patent [19]

Ernst

[11] 4,045,723
[45] Aug. 30, 1977

[54] TWO DIMENSIONAL GYROMAGNETIC RESONANCE SPECTROSCOPY

[75] Inventor: Richard R. Ernst, Winterthur, Switzerland

[73] Assignee: Varian Associates, Inc., Palo Alto, Calif.

[21] Appl. No.: 640,364

[22] Filed: Dec. 15, 1975

[51] Int. Cl.² ............................................. G01R 33/08
[52] U.S. Cl. ................................. 324/.5 A; 324/.5 R
[58] Field of Search ................. 324/.5 A, .5 AC, .5 R

[56] References Cited

U.S. PATENT DOCUMENTS

| | | | |
|---|---|---|---|
| 3,215,930 | 11/1965 | Turner | 324/.5 AC |
| 3,753,081 | 8/1973 | Freeman | 324/.5 A |
| 3,824,452 | 7/1974 | Freeman | 324/.5 AC |

*Primary Examiner*—M. Tokar
*Attorney, Agent, or Firm*—Stanley Z. Cole; Gerald M. Fisher

[57] ABSTRACT

The multiplet spectral structure produced by coupled gyromagnetic resonators, such as heteronuclear coupling, is resolved by inducing a train of transient free induction decay (FID) resonances of a first group of gyromagnetic bodies, such as carbon-13 nuclei coupled to a second group of gyromagnetic bodies, such as protons, and detecting the FID resonance. A decoupling r.f. magnetic field is applied to the second group during free induction decay resonance of the first group for decoupling the spins of the first and second groups during detection of resonance of the first group. The duration of the decoupling effect is changed from one successive free induction decay resonance to the next and the detected resonance data is stored as a function of the change in the decoupling effect. The detected resonance data which is a function of two time intervals is then double Fourier transformed into the frequency domain and displayed as a two dimensional plot for resolving the multiplet structure of the spectra of the first group of gyromagnetic bodies.

13 Claims, 6 Drawing Figures

TWO DIMENSIONAL SPECTROSCOPY PROGRAM FLOW CHART

TWO DIMENSIONAL GYROMAGNETIC RESONANCE SPECTROSCOPY

BACKGROUND OF THE INVENTION

The present invention relates in general to gyromagnetic resonance spectroscopy and more particularly to an improved method of such spectroscopy wherein multiplet structure of coupled gyromagnetic resonators is resolved.

DESCRIPTION OF THE PRIOR ART

Heretofore, carbon-13 nuclear magnetic resonance has become of major importance for the investigation of the structure of organic molecules in solution and in the solid state. The outstanding feature of $^{13}C$ resonance is certainly a possibility to obtain completely proton-decoupled spectra with one single resonance line for each carbon site. This simplifies the spectra of large molecules. Although coupled spectra, i.e., proton-carbon and proton-nitrogen coupled spectra contain much more information, they often cannot be analyzed completely because of severe overlap of various multiplets. A most prominent example of coupled nuclei are proton coupled carbon-13 and proton coupled nitrogen-15 and possibly proton coupled deuterium. The use of carbon-13 and nitrogen-15 and possible deuterium spectra is of particular interest for the investigation of complex molecules like biomolecules, enzymes, peptides, proteins and complicated organic molecules in general.

Up to now most spectra of rare nuclei have been recorded in a completely proton-decoupled mode, thereby eliminating the proton-carbon or proton-nitrogen couplings to simplify the spectra. The problem with simplifying the spectra by decoupling the protons from the other nuclei under observation is that all the information contained in the coupling constants is destroyed. One possibility for partially recovering the information contained in the heteronuclear coupling constants is a method of off-resonance decoupling. However, this method of decoupling does not permit a quantative analysis of the results and weak couplings are eliminated completely. As a result, complete interpretation of the multiplet structure of rare nuceli is possible only for simple spectra, i.e., from small molecules.

SUMMARY OF THE PRESENT INVENTION

The principal object of the present invention is the provision of an improved method of and apparatus for resolving multiplet structures of spectra under analysis.

In one feature of the present invention, a train of transient gyromagnetic free induction decay (FID) resonances of a coupled first group of gyromagnetic body is obtained. The resonance of the first group of gyromagnetic bodies is periodically decoupled from a second group of resonators to derive coupled and decoupled periods of resonance during each free induction decay resonance of the first group of resonators. The durations of the coupled and the decoupled periods are changed in successive transient resonances and the resonance of the first group is detected during the decoupled period. The data from successive transients is analyzed as a function of the changing duration of the coupled to the decoupled periods to derive gyromagnetic resonance data about said first group of resonators from which to derive simplified gyromagnetic resonance spectral data.

In another feature of the present invention, the detected transform gyromagnetic resonance data is transformed by twodimensional Fourier from the time domain into the frequency domain to obtain two dimensional spectral data.

In another feature of the present invention, the two-dimensional spectral data is displayed in a two-dimensional plot, whereby the multiplet structures of the spectra are resolved visually by mere inspection of the display.

In another feature of the present invention, the sensitivity of the spectral data is enhanced by applying a decoupling radio frequency field prior to inducing the free induction decay resonance of the resonators under analysis.

In another feature of the present invention, the multiplet structures associated with a particular gyromagnetic resonator site, such as a carbon site in a complex molecule, is selectively observed by selecting its contribution from the contributions of the other sites during the free induction decay of resonance by means of an analog or digital band pass filter, by means of a phase sensitive detector driven with a suitable reference frequency, or most simply by adjusting the carrier frequency of the spectrometer to this particular resonace and using a low pass filter. In this manner, the computer storage required for analysis of the data is substantially reduced.

In another feature of the present invention, the coupled and decoupled periods are reversed and the free induction decay resonance is detected only during a spin coupled period of the FID, whereby the required number of resonances is minimized to resolve all multiplet structures.

Other features and advantages of the present invention will become apparent upon a perusal of the following specification taken in connection with the accompanying drawings wherein:

DESCRIPTION OF THE PREFERRED EMBODIMENTS

Figure 1:
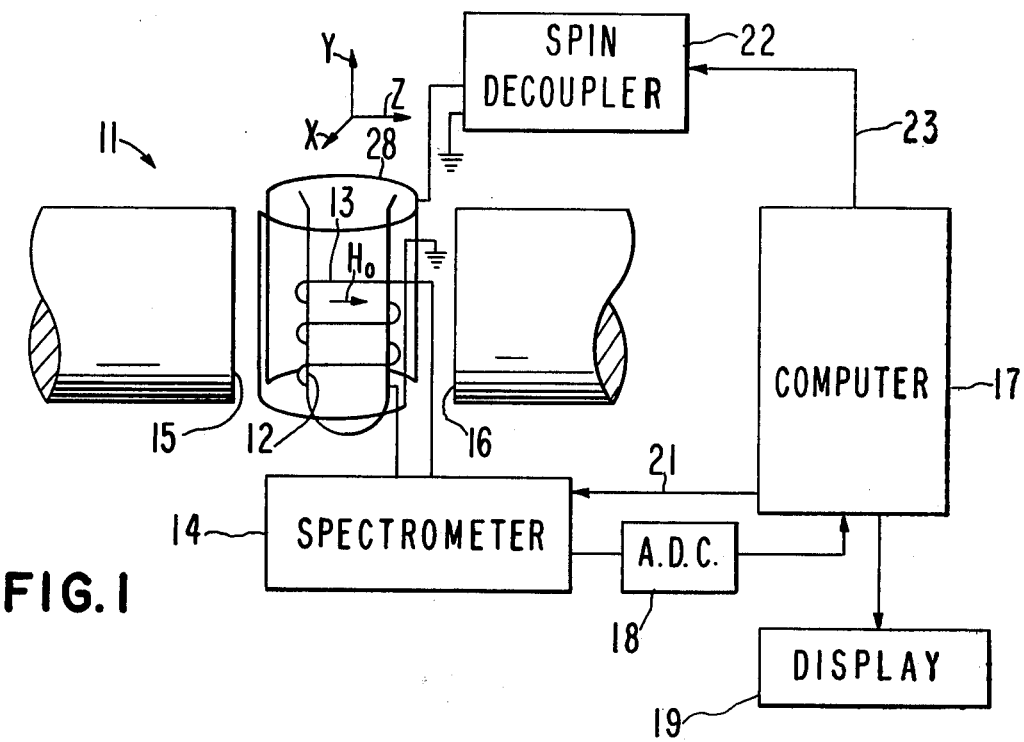
FIG. 1 is a schematic diagram, partly in block diagram form, of a gyromagnetic resonance spectrometer incorporating features of the present invention.
Figure 2:
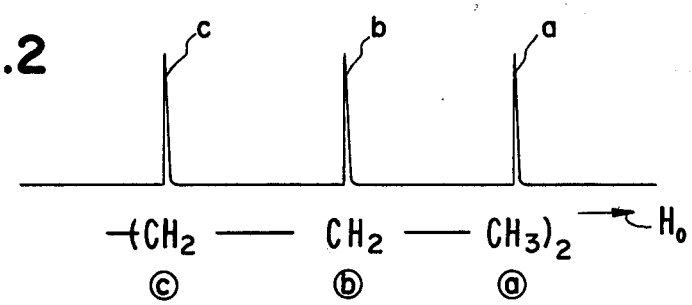
FIG. 2 is a gyromagnetic resonance proton decoupled spectrum for the carbon-13 sites ⓐ, ⓑ and ⓒ of the n-hexane molecule indicated below the spectrum of FIG. 2.
Figure 3:
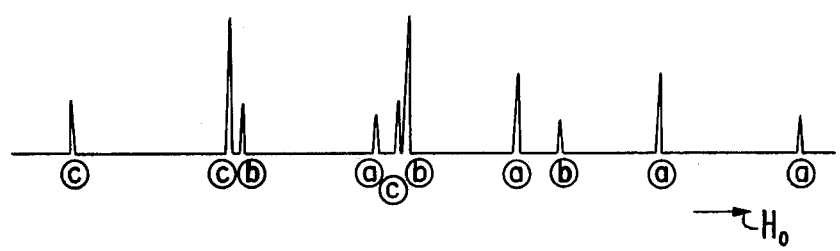
FIG. 3 is a proton-coupled gyromagnetic resonance spectrum for the carbon-13 sites of the molecule of FIG. 2 depicting the multiplet structures associated with each of the proton-coupled carbon-13 sites ⓐ, ⓑ and ⓒ.
Figure 4:
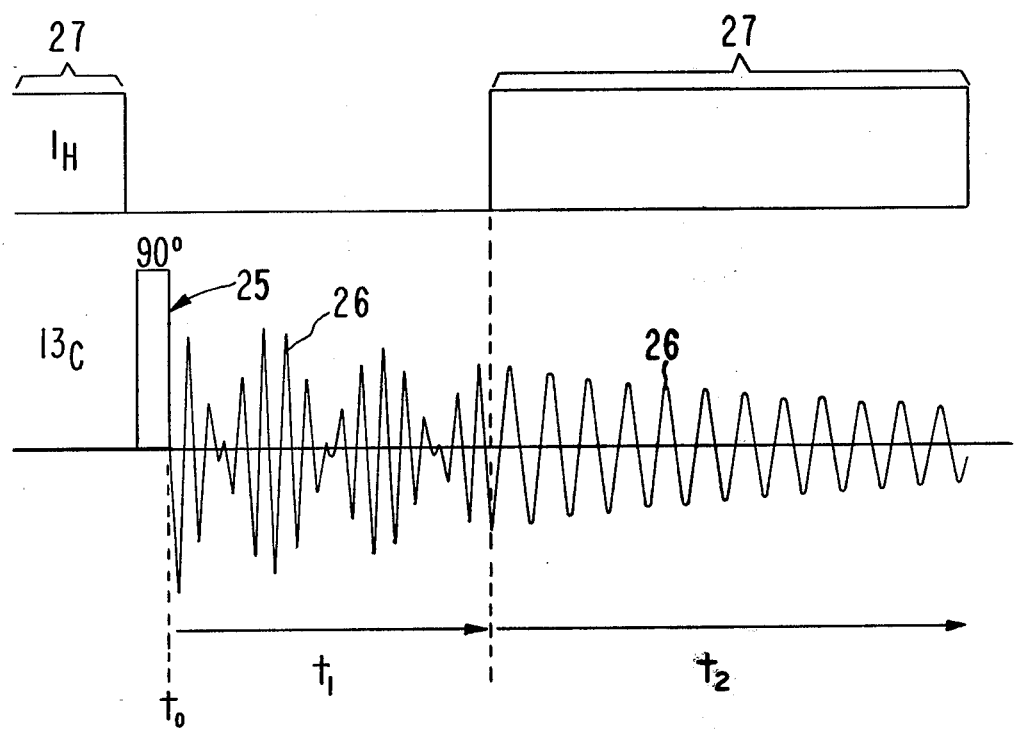
FIG. 4 is a timing diagram showing the timing of the proton-decoupling field and of the free induction decay resonance signal for the carbon-13 sites derived by spectrometer of FIG. 1.

Referring now to FIG. 1 there is shown a gyromagnetic resonance spectrometer 11 incorporating features of the present invention. Briefly, the spectrometer 11 includes a container 12 for containing gyromagnetic resonators such as atomic nuclei or unpaired electrons to be analyzed. In typical example, the sample container 12 may contain relatively complex molecules such as biomolecules, enzymes, peptides, proteins or complicated organic molecules in general.

A common transmitter/receiver coil 13 is disposed coaxially surrounding the container 12, such coil being wound in axial alignment with the Y axis of the Cartesian coordinate system indicated in FIG. 1. The single transmitter/receiver coil 13 is connected to a single coil gyromagnetic resonance spectrometer 14, such as a Varian Model CFT-20 or a Bruker Model SPX 4-100.

The sample under analysis is disposed in a relatively intense unidirectional polarizing magnetic field $H_0$ produced between the pole faces 15 and 16 of a relatively large electromagnet, such as a 15 inch diameter pole face electromagnet.

Figure 5:
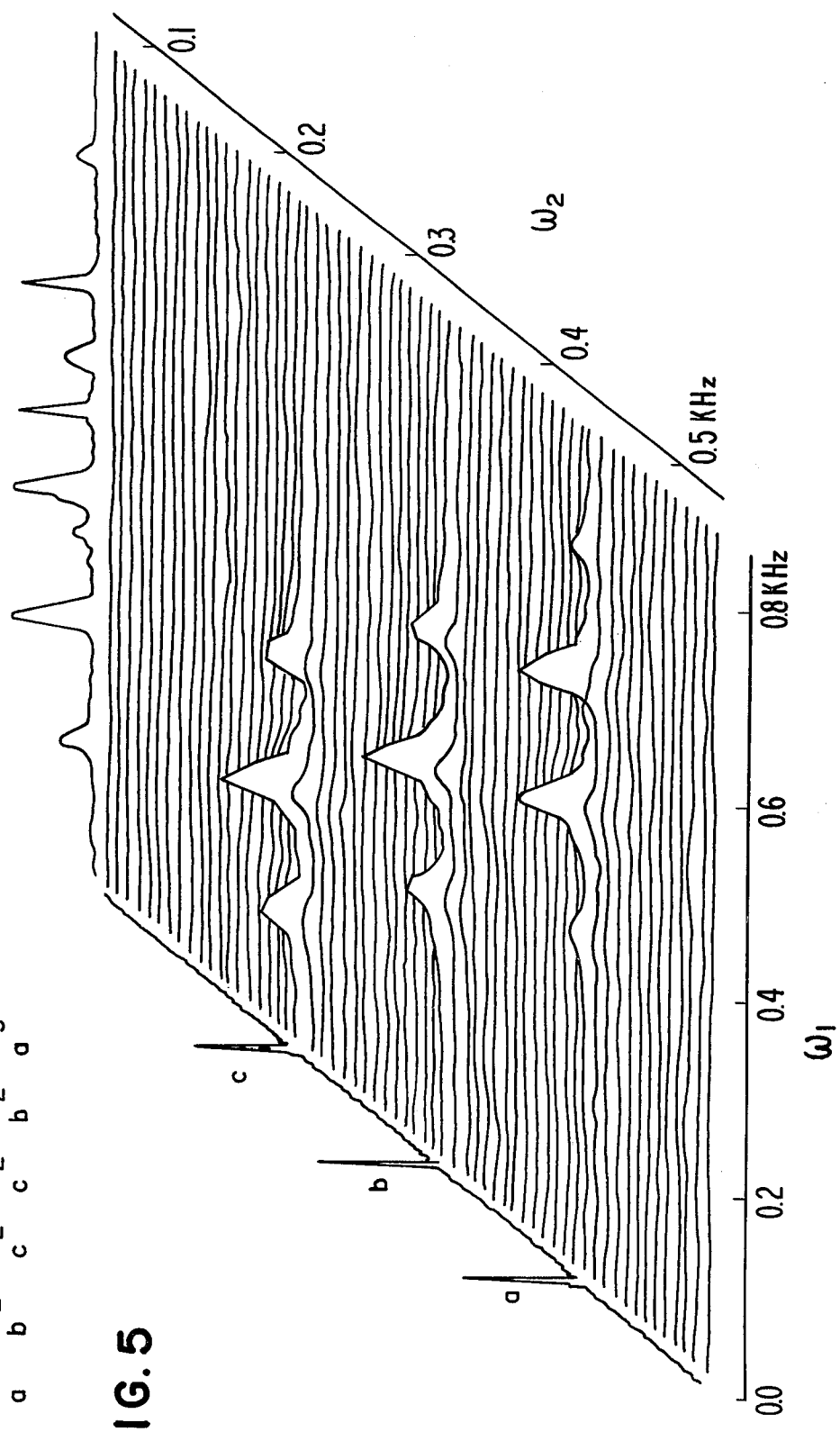
FIG. 5 is a two-dimensional plot of the resonance spectral data derived from the spectrometer of FIG. 1.

The spectrometer 14 is interfaced with a digital computer 17, such as a Varian 620/L-100 having a 12 K bit memory, via the intermediary of an analog-to-digital converter 18. One output of the computer 17 is fed to a display print out 19 for obtaining 2D spectral displays of the resonance spectra of the sample under analysis. A typical 2D display is shown in FIG. 5. A synchronize and excute line 21 feeds signals from the computer 17 to the spectrometer 14 for placing the spectrometer under the control of the computer 17.

A spin decoupler 22 is interfaced with the computer 17 and put under the control of the computer 17 via synchronize and execute line 23. The spin decoupler applies radio frequency power to the sample under analysis for decoupling the resonance of the magnetic resonators under analysis from other coupled resonators such as other heteronuclear gyromagnetic resonator bodies coupled to the gyromagnetic resonator sites under analysis. In the case of a carbon-13 sample site under analysis, the spin decoupler 22 applied a band of radio frequency energy to the sample with the polarization of the decoupling magnetic field being perpendicular to the direction of the polarizing field $H_0$. In case of wide band decoupling, the excitation is selected to have a bandwidth sufficiently broad to cover the resonance spectrum of the resonators to be decoupled. In the case of protons the bandwidth of the excitation would be sufficiently broad, i.e., a few thousand Hertz, to cover the gyromagnetic resonance spectrum of the protons to be decoupled.

The spin decoupling magnetic field is applied to the sample by coupling the RF power from decoupler 22 into a second coil 28 disposed orthogonally to the transmit/receive coil 13 and to the direction of the polarizing magnetic field $H_0$. The electromagnetic, which supplies the polarizing field, typically includes a field frequency lock or a flux stabilizer, not shown and of conventional design for locking the intensity of the polarizing magnetic field $H_0$ to the frequency of a predetermined gyromagnetic resonance line of a sample in the conventional manner.

Referring now to FIGS. 1–5, the operation of the two-dimensional (2D) gyromagnetic resonance spectrometer 11 of FIG. 1 will be described. In operation, the spectrometer 14 applies a train of pulses of radio frequency magnetic field via coil 13 to the sample under analysis with the container 12. The frequency of the applied radio frequency magnetic field is selected by the resonance frequency of the gyromagnetic resonators to be analyzed, such as for example the carbon-13 nuclei of the sample, such as the h-hexane molecule, as shown associated with FIG. 2.

The intensity of the applied RF magnetic field is chosen so that during the duration of each RF pulse, the nuclear magnetic moments of the sample gyromagnetic resonators to be observed such as the carbon-13 nuclei, are tipped relative to the direction of the polarizing magnetic field $H_0$, i.e., they are tipped to provide a projection onto the XY plane. Following the pulse 25 (eg a 90° pulse), namely at $t_o$, the gyromagnetic resonators, i.e., carbon-13 nuclei in this case, enter into a free induction decay (FID) resonance signal of the character indicated by waveform 26 of FIG. 4. The nuclei are allowed to continue their free induction decay in a couple mode for a period $t_1$ i.e., the carbon-13 nuclei are magnetically spin coupled to the proton nuclei surrounding each of the carbon atoms ⓐ, ⓑ and ⓒ. During this period the waveform 26 is characteristic of the spectrum of FIG. 3 in which the multiplet structures of nuclei ⓐ, ⓑ and ⓒ overlap. Accordingly it is the purpose of the present invention to resolve, i.e., to separate the multiplet structure ⓐ, ⓑ and ⓒ in such a way that they can be readily identified with each of their respective carbon sites or decoupled resonance lines ⓐ, ⓑ and ⓒ of FIG. 1. Therefore, following the interval $t_1$, the proton decoupler 22 is turned on and the FID 26 is sampled by the analog to digital converter 18 at equal intervals of time, as of 0.5 miliseconds, for N samples during the period $t_2$. The spin decoupler 22 applies a relatively broadband of power to the sample under analysis for exciting resonance of the proton spectral lines, thereby spin decoupling the protons from the carbon-13 nuclei under analysis. The experiment is repeated for M different but equally spaced values of $t_1$, a set of N values being sampled in each case during the interval $t_2$. The data from successive experiments, corresponding to different values of $t_1$, is stored in successive rows of a matrix as indicated in table I.

TABLE I

|  | $(t_2)_1$ | $(t_2)_N$ |
| --- | --- | --- |
| $(t_1)_1$ | $S_{11}$ | $S_{1N}$ |
| $(t_1)_2$ | $S_{21}$ | $S_{2N}$ |
| $(t_1)_M$ | $S_{M1}$ | $S_{MN}$ |

The maximum number of samples representing the 2D display of spectral data to be derived from the table is limited by the available memory size of the computer 17. The data of Table I is transformed by a two dimensional Fourier transform to give a two-dimensional spectral display with $M/2 \times N/2$ samples. To permit the use of a fast Fourier transform computational routine in the computer 17, M and N are usually selected to be powers of 2. In the example of FIG. 5, M is chosen to equal N.

A well known procedure to obtain a finer representation of a Fourier transform is the addition of a set of zeros to the array to be transformed, as is indicated in *The Journal of Magnetic Resonance*, vol. 11 p. 9 of 1973. A simple method which requires $N(N+2)$ memory locations, only, but produces an $N \times N$ two-dimensional display is the following one: N free induction decay signals consisting of N samples are stored in the memory. To perform the first Fourier transformation, the N samples representing the free induction decay K, [$S_{ko}$, $S_{k1}$ ..., $S_{kN-1}$] are transferred to a separate memory block and are augmented by N zero values, [$S_{ko}$, $S_{k1}$ ..., $S_{kN-1}$, 0,0 ... 0]. The Fourier transform consists then of N complex values [$\$_{ko}$, $\$_{k1}$, ..., $\$_{KN-1}$]. The real parts, [$R_{ko}$, $R_{k1}$ ..., $R_{N-1}$], are retained only and are stored back in place of the original free induction decay signal (FID). After transformation of all FID's, the matrix

[$R_{kj}$] is transposed, [$R_{kj}$] → [$R_{jk}$]; and each row, augmented by Y zero values, is Fourier transformed a second time. The absolute values of the $n^2$ complex Fourier coefficients are then utilized for the plot of a two-dimensional spectrogram of FIG. 5. It can easily be shown that the neglect of the imaginary part after the first Fourier transformation does not cause any loss of information nor does it deteriorate the sensitivity.

The limited number of samples available to represent each FID calls for a careful selection of the center frequency and of the sampling rate such that the spatial resolution is sufficient without violating the sampling therorem and violating frequency foldover which can seriously distort a two-dimensional spectrogram. The dispersion like parts as well must be represented. Dispersion mode signals have a much higher tendency to cause problems with frequency foldover than absorption mode signals because of the much broader wings.

The number of samples N has been selected to be 64. This results in a total of 4096 sample values.

Figure 6:
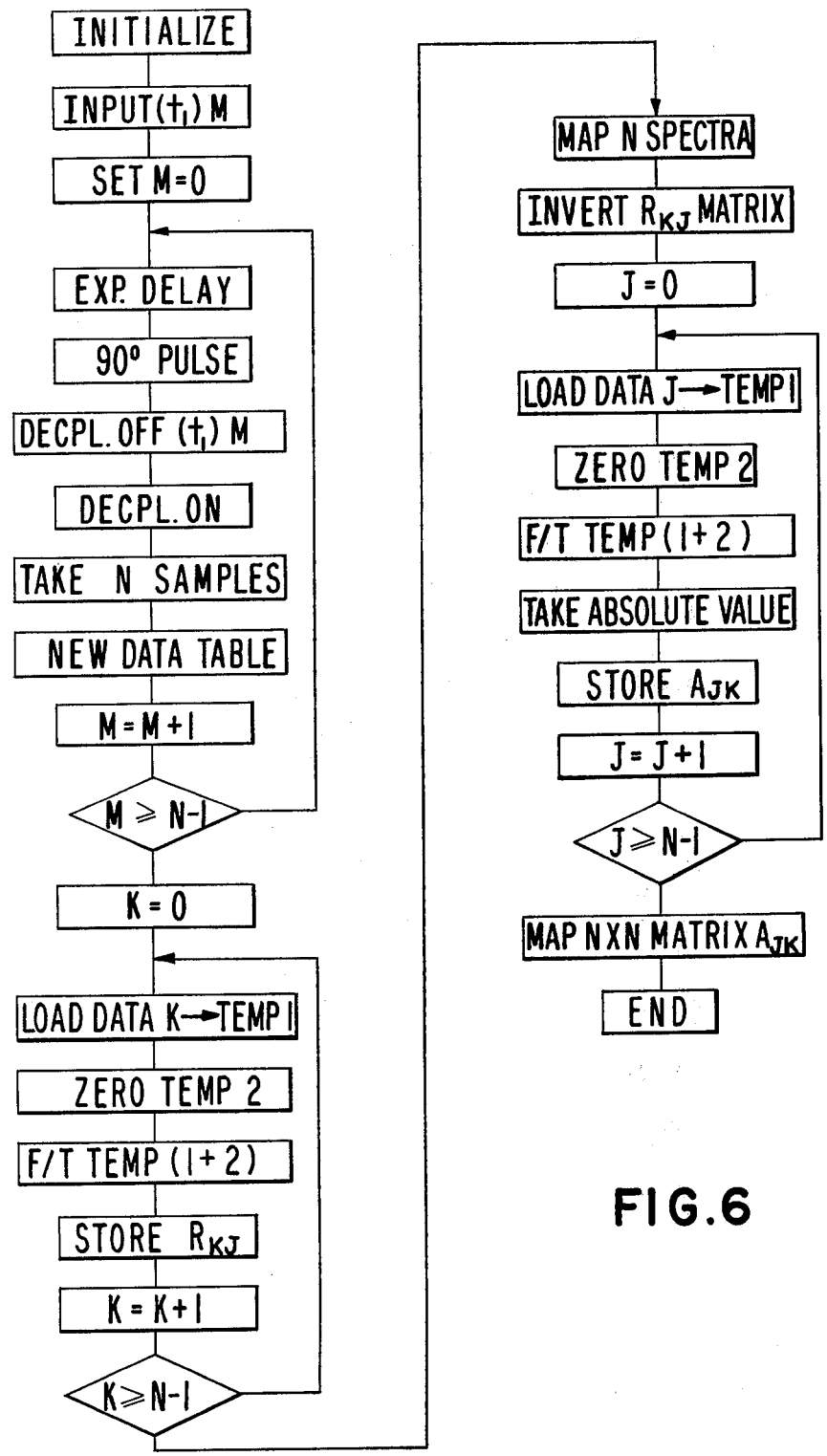
FIG. 6 is a computer flow chart for the program of the computer of FIG. 1.

FIG. 6 discloses an embodiment of a flow chart for a computer program to control the spectrometer 11 and to acquire and process the resonance spectral data and to display the two-dimensional spectrogram of FIG. 5.

A computer program for programming the computer 17 to derive the two-dimensional spectrograms with the apparatus of FIG. 1 is an unpublished appendix to the printed specification and a copy thereof is contained in the official U.S. Patent Office file history of this patent.

Thus in summary, the method and apparatus of the present invention provides means to record two-dimensionally resolved coupled gyromagnetic resonance spectra which permit a complete analysis by inspection even for large molecules. The technique includes creating at time $t = 0$ a transverse magnetization of the gyromagnetic resonators, such as carbon 13 nuclei, by means of for example a 90° pulse. During the time $0 < t < t_1$, the magnetization is allowed to precess under the influence of the complete Hamiltonian, i.e. in the coupled modes At $t = t_1$, broadband decoupling is started and the FID signal is recorded as a function of $t_2 = t - t_1$. This experiment is repeated for various values of $t_1$ and it produces a two-dimensional 2D signal function $s(t_1 t_2)$. A 2D Fourier transform generates, finally, the 2D spectrum:

$$S^{cc}(\omega_1, \omega_2) = \int_0^\infty \int_0^\infty dt_1 dt_2 \cos(\omega_1 t_1) \cos(\omega_2 t_2) s(t_1, t_2).$$

An example of a 2D resolved 13C spectrum of h-hexane is shown in FIG. 5. It is clearly seen that parallel to the $\omega_1$-axis the full multiplet structure is retained, whereas on the $\omega_2$-axis a completely decoupled specturm is obtained. Each peak in the 2D plot corresponds to the one multiplet line of the spectrum (shown along the $\omega_1$-axis) displaced in the $\omega_2$ direction by the chemical shift of the corresponding carbon. The coupled spectrum can be considered as a projection of the 2D spectrum onto the $\omega_1$-axis, while the decoupled specturm is the projection of the 2D spectrum onto the $\omega_2$ axis. Whenever the decoupled specturm is completely resolved, each multiplet appears separated in the 2D plot of FIG. 5.

Several modifications of the aforedescribed technique are of interest. In a first modification of sensitivity of the technique is enhanced by using a full nuclear Overhauser effect by applying an RF magnetic field to the sample for exciting resonance of the nuclei to be decoupled, such as the proton nuclei, before applying the initial 90° 13C pulse 25.

In a second modification it is possible to selectively observe one particular carbon site I by filtering out its contribution during the time $t > t_1$ by means of an analog or digital band pass filter, by means of phase sensitive detector driven by a suitable reference frequency, or most simply by adjusting the carrier frequency of the 13C spectrometer 14 to this particular resonance and using a low pass filter for passing the FID resonance data to the analog to digital converter 18. This modification reduces the large computer storage required for the complete 2D data array.

In a third modification each FID ($Si_1$—$Si_N$) resulting from an experiment at a particular value i of $t_1$ can be Fourier transformed to the corresponding frequency domain spectrum and the amplitude of a particular frequency value or values of interest (i.e., the resonances of lines ⓐ, ⓑ and ⓒ of FIG. 2) are selected and stored in Table II as a function of the time interval $t_1$ and the line number.

TABLE II

| $(t_2)_1$ | | $(t_2)_m$ |
|---|---|---|
| $S_{a1}$ | $S_{ai}$ | $S_{am}$ |
| $S_{b1}$ | $S_{bi}$ | $S_{bm}$ |
| $S_{c1}$ | $S_{ci}$ | $S_{cm}$ |

After completion of M experiments the individual rows of the table are Fourier transformed to yield the multiplet spectra for the individual line ⓐ or ⓑ or ⓒ.

In this way the computer data storage can be reduced from M X N to M times the number of lines of interest.

In a third modification, it is possible to minimize the number of experiments to be performed for different $t_1$ values by applying the proton decoupling power 27 during the time $o < t < t_1$ and in the second time interval $t > t_1$ to let the spins process under the influence of the complete Hamiltonian, i.e., in the complete coupled mode. The number of experiments required to resolve all carbon resonances is then given by N-4F/Δ, where Δ is the minimum line separation in the decoupled spectrum and F is the total spectral range covered.

The use of the term "decoupling" as used herein as a means of modifying the interation between the first group of spins and the second group of spins is used as an example only. The perturbation need not nearly completely destroy the interaction, i.e., the decoupling may be only partial, and other forms of perturbation can also be used without departing from the scope of the invention. In other words, the interaction need only be changed during the free induction signal of one of the groups and the FID detected following the change of the interaction.

The data stored in Table I or Table II may also represent the summation of data from the repetition of each experiment in accordance with well known time averaging techniques.

What is claimed is:

1. In a method of gyromagnetic resonance two-dimensional spectroscopy, the steps of:
    inducing a plurality of transient gyromagnetic resonances of a first group of gyromagnetic resonators coupled to a second group of gyromagnetic resonators within a sample of matter to be analyzed;
    periodically and during only a portion of said transient gyromagnetic resonances of said first group of gyromagnetic resonators perturbing the interaction of the resonance of said first group of gyromagnetic resonators with the second group of resonators to derive a perturbed period of resonance and a coupled period of resonance during each transient resonance of said first group of resonators;

changing the duration of one of said perturbed and coupled periods of successive ones of said transient resonances of said first group of resonators; and detecting the induced plurality of said transient gyromagnetic resonances of said first group, as a function of the changing duration of said one of said perturbed and coupled periods of said transient resonances of said first group of resonators to derive gyromagnetic resonance data about said first group of resonators from which to derive simplified gyromagnetic resonance spectral data.

2. The method of claim 1 including the step of double Fourier transforming said detected transient gyromagnetic resonance signal data from the time domain into the frequency domain to obtain Fourier transformed gyromagnetic resonance spectral data from which to derive two-dimensional spectral data.

3. The method of claim 2 including the step of forming a two-dimensional spectral display of said Fourier transformed frequency domain spectral data for spatially separating multiplet spectral structures associated with respective different sites of resonators within said first group of resonators.

4. The method of claim 1 wherein the step of changing the time duration of one of said coupled and said perturbed periods of said transient gyromagnetic resonances includes the steps of applying a decoupling radio frequency magnetic field to said sample to excite resonance of said second group of resonators, and changing the duration of the off time of the applied radio frequency decoupling magnetic field applied during the transient resonances of said first group of resonators for decoupling the resonance of said first group of resonators from the effects of said second group of resonators.

5. The method of claim 1 including the step of exciting resonance of said second group of gyromagnetic resonators prior to inducing each of said free induction decay transient gyromagnetic resonances of said first group of gyromagnetic resonators whereby the sensitivity of the spectroscopy is enhanced due to a full Overhauser effect.

6. The method of claim 1 wherein said first group of resonators includes resonators having first and second different resonant frequencies and including the step of selectively detecting only free induction decay resonance of those of said first group of resonators having said first resonant frequency.

7. The method of claim 1 wherein said transient gyromagnetic resonances of said first group are detected only during said perturbed periods of transient resonances.

8. The method of claim 1 wherein said transient gyromagnetic resonances of said first group are detected only during said coupled periods of transient resonances.

9. In a gyromagnetic resonance two-dimensional spectrometer:

means for inducing a plurality of transient gyromagnetic resonances of a first group of gyromagnetic resonators coupled to a second group of gyromagnetic resonators within a sample of matter to be analyzed;

means for periodically and during only a portion of said transient gyromagnetic resonances of said first group of gyromagnetic resonators perturbing the interaction of the resonance of said first group of gyromagnetic resonators with the second group of resonators to derive a perturbed period of resonance and a coupled period of resonance during each transient resonance of said first group of resonators;

means for changing the duration of one of said perturbed and coupled periods of successive ones of said transient resonances of said first group of resonators; and means for detecting the induced plurality of said transient gyromagnetic resonances of said first group, as a function of the changing duration of said one of said perturbed and coupled periods of said transient resonances of said first group of resonators to derive gyromagnetic resonance data about said first group of resonators from which to derive simplified gyromagnetic resonance spectral data.

10. The apparatus of claim 9 including means for double Fourier transforming said detected transient gyromagnetic resonance data from the time domain into the frequency domain to obtain Fourier transformed gyromagnetic resonance spectral data from which to derive two dimensional spectral data.

11. The apparatus of claim 10 including means for forming a two-dimensional spectral display of said Fourier transformed frequency domain spectral data for spatially separating multiplet spectral structures associated with respective different sites of resonators within said first group of resonators.

12. The apparatus of claim 9 wherein said means for changing the time duration of one of said coupled and said perturbed periods of said transient gyromagnetic resonances includes means for applying a decoupling radio frequency magnetic field to said sample to excite resonance of said second grou of resonators, and means for changing the duration of the off time of the applied radio frequency decoupling magnetic field applied during the transient resonances of said first group of resonators from decoupling the resonance of said first group of resonators from the effects of said second group of resonators.

13. The apparatus of claim 9 including means for exciting resonance of said second group of resonators prior to inducing each of said free induction decay transient gyromagnetic resonances of said first group of gyromagnetic resonators, whereby the sensitivity of the spectroscopy is enhanced due to a full Overhauser effect.

* * * * *

UNITED STATES PATENT AND TRADEMARK OFFICE
CERTIFICATE OF CORRECTION

PATENT NO. : 4,045,723
DATED : August 30, 1977
INVENTOR(S) : Richard R. Ernst, Winterthur, Switzerland It is certified that error appears in the above-identified patent and that said Letters Patent are hereby corrected as shown below:

Column 3, line 62, "by" should read --at--;
Column 4, line 19, "FIG. 1" should read --FIG. 2--;
Column 5, line 2, "Y" should read --N--;
Column 5, line 3, "$n^2$" should read --$N^2$--;
Column 6, line 38, "process" should read --precess--;
Column 8, line 48, "grou" should read --group--.

Signed and Sealed this

Third Day of February 1981

[SEAL]

Attest:

RENE D. TEGTMEYER

Attesting Officer  Acting Commissioner of Patents and Trademarks